United States Patent [19]
Ishii et al.

[11] Patent Number: 5,368,674
[45] Date of Patent: Nov. 29, 1994

[54] METHOD OF TREATING GLASS FIBER-BASED PREPREG

[75] Inventors: Kenji Ishii; Yasunori Tagami, both of Tokyo, Japan

[73] Assignee: Mitsubishi Gas Chemical Company, Inc., Tokyo, Japan

[21] Appl. No.: 213,840

[22] Filed: Mar. 16, 1994

Related U.S. Application Data

[63] Continuation of Ser. No. 824,563, Jan. 23, 1992, abandoned, which is a continuation-in-part of Ser. No. 578,152, Sep. 6, 1990, abandoned.

[30] Foreign Application Priority Data

Sep. 7, 1989 [JP] Japan .................................. 1-23064

[51] Int. Cl.⁵ .............................................. B32B 31/00
[52] U.S. Cl. ............................. 156/272.2; 156/308.2; 219/553; 392/407
[58] Field of Search ........................ 219/553; 392/407; 156/308.2, 272.2

[56] References Cited

U.S. PATENT DOCUMENTS 4,824,730  4/1989  Fukuda et al. .................. 219/553 X
5,077,461 12/1991  Hasegawa .......................... 219/553

FOREIGN PATENT DOCUMENTS 158216  1/1988  Japan .

*Primary Examiner*—Chester T. Barry
*Attorney, Agent, or Firm*—Sughrue, Mion, Zinn, Macpeak & Seas

[57] ABSTRACT

A method of treating a glass fiber-based prepreg for use in production of laminates, copper-clad laminates, multilayer printed wiring boards, or the like by heat treating a B-staged, glass fiber-based prepreg cut into a predetermined size with a far infrared ceramic heater to a temperature not higher than the softening point of a matrix resin of the prepreg for a short period of time.

2 Claims, No Drawings

METHOD OF TREATING GLASS FIBER-BASED PREPREG

CROSS REFERENCE TO THE RELATED APPLICATION

This is a continuation of application No. 07/824,563 filed Jan. 23, 1992, now abandoned, which is a continuation-in-part of application No. 07/578,152 filed Sep. 6, 1990, now abandoned.

FIELD OF THE INVENTION

The present invention relates to a method of treating a glass fiber-based prepreg which is for use in production of laminates, copper-clad laminates, multilayer printed wiring boards, or the like and which has been cut into a predetermined size. More particularly, the present invention relates to a method of treating such a prepreg to fix resin powder particles generated from the matrix resin of the prepreg by cutting, without substantially melting the matrix resin, to thereby not only attain good working atmosphere for combining prepregs and for other operations but also greatly diminish defects attributable to dust generation.

BACKGROUND OF THE INVENTION

Prepregs containing woven or non-woven glass fabrics as a substrate are generally prepared by impregnating such fabrics with thermosetting resins and B-staging the impregnated systems (namely, a semi-cured state that, upon heating, the systems once melt and then heat-cure). In most cases, the prepregs are used in the manufacture of laminates, copper-clad laminates, multilayer printed wiring boards, and the like after cutting the same into predetermined sizes.

Cutting of B-staged, resin-impregnated substrates (prepregs) in continuous form into predetermined sizes has conventionally been conducted by means of rotary cutters or shearing cutters at ordinary temperature, with the single prepreg being cut at a time or with a plurality of prepregs being superposed and cut simultaneously. In this cutting method, the glass fiber substrate at the cut edges is partly broken into powder, while the semi-cured matrix resin at the cut edges is also broken into powder over the area ranging from the cut edges to about 0.5 to 2 mm inside the edges. If the cut prepregs in such a state are, as they are, transported and combined to produce laminates or other products, the glass and resin powder particles generated are not only scattered in the air to impair the working atmosphere, but fall as foreign matter on laminates or other products to be manufactured during the laminating step.

In order to eliminate these problems, it has been proposed to heat the edges of a cut prepreg to a temperature not lower than the softening point of the matrix resin but not higher than the hardening temperature of the resin by means of infrared rays, hot air, hot platens, or the like, to thereby melt the edges as disclosed in, for example, JP-A-63-158216 (the term "JP-A" as used herein means an "unexamined published Japanese patent application"). It has also been proposed to cut off the edges of a cut prepreg after the edges are heated to a temperature not lower than the softening point of the matrix resin but not higher than the hardening temperature of the resin, by means of infrared rays, hot air, hot platens, or the like as disclosed in, for example, JP-A-63-158217. However, the former method is disadvantageous in that heating to the softening point (the melting initiation temperature or melting temperature) or a higher temperature needs relatively much time, and that because the heating temperature is too high, the heated parts of the prepreg are changed in property and become to have tackiness to disadvantageously adhere to other substances. The latter method is also disadvantageous in that the melted or softened resin tends to adhere to the cutter blade during cutting and the resin adhered to the blade should be removed for smooth cutting. Furthermore, both methods are disadvantageous in that since the temperature of the matrix resin of the prepreg is raised to the softening point of the resin or a higher temperature, the curing properties of the matrix resin are changed.

SUMMARY OF THE INVENTION

The present inventors have made intensive studies to develop a prepreg-treating method which can prevent a B-staged, glass fiber-based cut prepreg from releasing dust particles generated from the matrix resin of the prepreg without changing the properties of the prepreg. As a result, the present invention has been completed.

Accordingly, an object of the present invention is to provide a method of treating a glass fiber-based prepreg, which can overcome the disadvantages in the prior art.

The method of treating a glass fiber-based prepreg according to one embodiment of the present invention comprises heating a B-staged, glass fiber-based prepreg which has been cut into a predetermined size, for a short period of time with a far infrared ceramic heater to a temperature not higher than the softening point of the matrix resin of the prepreg, thereby fixing matrix resin powder particles present on the surfaces and edges of the prepreg to the prepreg.

The method of treating glass fiber-based prepregs according to another embodiment of the present invention comprises superposing a plurality of B-staged, glass fiber-based prepregs which have been cut into a predetermined size, and then heating for a short period of time the surfaces of the superposed prepregs to a temperature not higher than the softening point of the matrix resin of the prepregs and, at the same time, heating for a short period of time the edges having a width of 10 mm or less of the prepregs, preferably 1 to 5 mm, to a temperature not lower than the softening point of the matrix resin, with a far infrared ceramic heater, thereby melt-adhering the prepregs at their edges.

DETAILED DESCRIPTION OF THE INVENTION

The B-staged, glass fiber-based prepreg which can be treated in the method of the present invention is not particularly limited as long as the prepreg is a prepreg using as a substrate a glass fiber for use in production of laminates, copper-clad laminates, multilayer boards, or the like, and is obtained by impregnating the glass fiber substrate with a resin which is in a glassy state at room temperature or by adhering such a resin to the glass fiber substrate. The glass fiber substrate for use in the present invention is normally a continuous substrate which contains glass fibers as an essential component. Examples of such a substrate include woven or non-woven glass fabrics made of fibers of various kinds of glasses such as E glass, S glass, D glass, and quartz glass, and woven or non-woven fabrics composed of combinations of glass fibers of the above kinds with other kinds of fibers such as alumina fibers and fibers of ultra-heat-resistant resins such as cellulose, all-aromatic polyamides, polyimides, fluoroplastics, poly(phenylene sulfide), polyetheretherketones, and polyetherimides. Examples of thermosetting resins which are used to impregnate the substrate include phenolic resins; polyester resins; epoxy resins of the bisphenol A type, novolak type, halogenated bisphenol A type, and halogenated novolak type, and other epoxy resins based on polyfunctional epoxy compounds having three or more epoxy groups; cyanic acid ester-based resins typically including cyanato resins, cyanate-epoxy resins, and cyanate-maleimide-epoxy resins; maleimide resins comprising polyfunctional maleimides (such as bismaleimide) and polyfunctional amides (such as bis(4-aminophenyl)methane); and mixtures of two or more of the above thermosetting resins.

The prepreg which is treated according to the method of the present invention is obtained by cutting the normally continuous prepreg which is a resin-impregnated glass fabric substrate and which has been B-staged. The cutting of such prepregs is normally done by means of a rotary cutter or shearing cutter at ordinary temperature or under heating, with the prepregs being cut separately, i.e., a single prepreg at a time, or a plurality of prepregs being superposed and cut simultaneously. In the prepreg thus cut, the glass fiber substrate at the cut edges is partly broken into powder, while the semi-cured matrix resin at the cut edges is also blushed or broken into powder over the area ranging from the cut edges to about 0.5 to 2 mm inside the edges. Further, part of the powder particles thus formed are scattered and are adhered to the surfaces of prepreg other than the cut edges.

The cut prepreg is heated, in the present invention, for a short period of time with a far infrared ceramic heater until the surface resin of the prepreg is heated to a temperature not higher than the melting and softening point of the resin, to thereby melt the powder particles generated as described above and fix them to the prepreg surfaces. The heating by a far infrared ceramic heater is not particularly limited as long as the prepreg is heated to the degree specified above. Normally, however, the conditions for powder particle fixing or for mutual melt-adhesion are suitably selected as follows; the distance between the heater surface and the prepreg surface is suitably selected from the range of 1 to 20 cm, the temperature of the heater surface from 200° to 600° C., and the treating period from 3 to 20 seconds. For example, in the case of treating the entire surface of the prepreg, it is preferred that the heater surface has a temperature of from 350° to 450° C., the treating period is from 3 to 10 seconds, and the surface temperature of the prepreg is lower than the softening point of the resin, preferably at least 5° C. lower than the softening point, and more preferably at least 10° C. lower than the softening point. Further, the edges of a plurality of the prepregs laminated are melted in a width of 10 mm or less, preferably 1 to 5 mm, the far infrared ceramic heater is constructed such that the temperature of at least those parts of the heater which heats the edges is controlled independently, in order that the edges only be melted and fixed simultaneously with fixing of resin powder particles on the other surfaces, with the surface temperature of those parts of the heater being set at a higher temperature than that of the inner part of the heater. The temperature of the heater surface is preferably selected from the range of from 400° to 600° C.

Further, if the width of the edges of the prepregs melted is broad, it takes much time after completion of heating until the heat of the melted portion is cooled to a temperature lower than the softening point of the prepreg resin by thermal conduction or the like. Therefore, too broad width is disadvantageous in that the melted (impregnated) resin in the edge portion tends to contact with a conveying device or the like, thereby adhering the melted resin to the device.

The far infrared ceramic heater used in the present invention is a type of using a ceramic resistor which generates heat upon application of electric current, and simultaneously emits a far infrared ray, and is not a type of heating a ceramic by a heating element. The far infrared ceramic heater emits far infrared rays having wavelength of from 1 to 30 $\mu$m. Further, the far infrared ceramic heater is such that the percentage of radiation to a black body is 85% or more, preferably 90% or more, at a wavelength of 5 to 15 $\mu$m. Further, it is particularly preferred that the radiation energy at a wavelength of 5 to 15 $\mu$m is at least 70% of the total radiation energy of far infrared ray which has a wavelength of 4 $\mu$m or more. Prepreg matrix resins such as epoxy resins show absorption peaks within that wavelength region. Because of this, the energy of the far infrared rays can be efficiently absorbed by the resin powder particles, so that the resin powder particles, which are not in close contact with the prepreg, can be melted and fixed to the prepreg before the temperature of the prepreg surfaces as well as that of the whole prepreg reaches the softening point of the matrix resin. Even if prepregs which have been thus treated to fix resin powder particles are superposed each other immediately after the treatment, blocking of the prepregs does not occur because the surface of the prepregs are not softened and are cooled soon. Further, even if prepregs are superposed and heat-treated in the superposed state, powder particles present inside the edges can be melted and fixed since far infrared rays easily penetrate at the prepreg edges where part of the matrix resin is present as powder particles. Furthermore, since the ambient air is not almost heated by the treatment, the surface temperature of the heater as well as that of the prepreg drops easily in a short period of time after the electric current to the heater is switched off, so that temperature control is easy. In addition, in the present invention, since the surface temperature of the prepregs is lower than the softening point of the prepreg resin, the prepregs can be superposed as they are, and since the inside temperature of the prepregs is further low, the surface temperature of the prepregs is further decreased by conduction of heat on the surface to the inside of the prepregs. Furthermore, in the case of melting the above-described edges of the prepregs, the surface temperature thereof can be easily cooled to a temperature lower than the softening point of the resin by only thermal conduction of heat into a low temperature portion inside the prepregs.

In the method of the present invention, if the temperature of the heater surface is increased or the treating time is prolonged, the temperature of the entire surface of the prepregs easily becomes a temperature higher than the softening point of the resin. However, such conditions involve various problems as same as in the case of using other heating method described below, and should be avoided.

On the other hand, there are other heating means such as ordinary infrared lamps and hot air. However, infrared lamps are very poor in resin-heating efficiency because infrared lamps emit rays having wavelength of from 1 to 10 μm, with most of the rays having wavelength of from 1 to 5 μm. Therefore, it is difficult to complete heating, melting, and fixing of resin powder particles only within a short period of time, so that the prepreg surfaces and ambient air are also heated to or above the softening point of the matrix resin. As a result, the prepreg itself may disadvantageously be heated to a temperature not lower than the softening point of the resin or cooling of the heated prepreg requires much time. Heating with hot air is also disadvantageous in that uniform heating is difficult and resin powder particles are scattered, and hence is unsuitable for resin powder fixing for prepregs.

As described above and as will be demonstrated by the following examples, dust generation ascribable to matrix resin powder particles formed by cutting of prepregs can be eliminated without changing the properties of the prepregs at all and, thus, the working atmosphere can be greatly improved by the prepreg-treating method of the present invention in which cut prepregs are heated for a short period of time with a far infrared ceramic heater to a temperature not higher than the softening point of the matrix resin of the prepregs.

Furthermore, since the treatment of the present invention is completed in a short period of time, it can be applied to conventional processes for producing prepregs without adversely affecting their production efficiencies. Therefore, the method of the present invention is of great industrial significance.

The present invention is explained below in detail by reference to the following Examples, which are not to be construed as limiting the scope of the invention.

EXAMPLE 1

A continuous, glass fiber-based epoxy prepreg (hereinafter referred to as "PP") comprising an E-glass plain weave fabric (width 1,040 mm, thickness 0.18 mm, basis weight 205 g/m$^2$) as a substrate and having a thickness of 0.19 mm was cut by means of a rotary cutter when the PP came out of the drying and heating zone in the production line.

The cut PPs had a resin content of 50% by weight, gel time at 170° C. of 130 seconds, resin flowability at 170° C. of 35% by weight, and softening point (temperature at which resin began to melt) of 80° C. In each of the cut prepregs, the matrix resin in the area ranging from the edges to about 1 mm inside the edges had been reduced to fine particles.

The eight PPs were superposed each other, and the resulting assembly was heat-treated with a far infrared ceramic heater, whereby resin powder particles present on the surfaces of both sides of the PP assembly and on the edges thereof were fixed to the PPs. The conditions for the treatment were as follows.

Heating apparatus:
Quick-heating-type far infrared heater QUT-40 manufactured by Teikoku Piston Ring Co., Ltd., Japan was used as heat source. Eleven heaters of the above kind were arranged in a row for each of the upper and lower side of the heating zone, with the distance between the upper and lower heaters being 40 mm. The PP assembly was moved between the upper and lower heaters.

| Surface temperature of the heater | 400° C. |
| --- | --- |
| Moving speed of PP assembly | 2.5 m/min |

-continued

| Heating period for PP assembly | 5 seconds |
| --- | --- |
| Surface temperature of PP assembly | 70° C. |
| Surface temperature of PP assembly after 1 second from passing of heating zone | 45° C. |
| Back side temperature of the uppermost PP | Ordinary temperature |

As a result, the resin powder particles on both side surfaces and edges of the thus-treated PP assembly had been completely fixed.

The thus-treated PPs showed the same gel time, resin flowability, and softening point (temperature at which resin began to melt) as those of the PPs before the treatment.

EXAMPLE 2

The same procedures as in Example 1 were repeated except that the surface temperature of both ends of each heater was set at 450° C. and that the PP assembly was moved in a manner such that the cut edges of the PPs were passed beside the ends of each heater.

| PP intermediate part | |
| --- | --- |
| Surface temperature of the heaters | 400° C. |
| Moving speed of PP assembly | 2.5 m/min |
| Heating period for PP assembly | 5 seconds |
| Surface temperature of PP assembly | 70° C. |
| Surface temperature of PP assembly after 1 second from passing of heating zone | 45° C. |
| Back side temperature of the uppermost PP | Ordinary temperature |
| PP edge part | |
| Width of melting portion | 5 mm |
| Temperature of melting portion | 85° C. |
| Temperature of melting portion after 1 second from passing of heating zone | 55° C. |

COMPARATIVE EXAMPLE

PP was treated in the same manner as in Example 1 except for the following conditions.

| Surface temperature of the heaters | 450° C. |
| --- | --- |
| Moving speed of PP assembly | 1.5 m/min |
| Heating period for PP assembly | 8.3 seconds |
| Surface temperature of PP assembly | 100° C. |
| Surface temperature of PP assembly after 1 second from passing of heating zone | 85° C. |
| Back side temperature of the uppermost PP | 80° C. |

As a result, the whole prepregs became a melted state, and fine particles were disappeared. However, there was observed adhering of the melted resin to a conveying device. Therefore, the prepregs was conveyed by passing the same through rolls which had been previously cooled, while forcibly cooling by blowing cold air. Further, when prepregs in which the inside temperature was about softening point of the resin were superposed, the temperature of the prepregs were gradually increased. Therefore, the prepregs could not be superposed until cooling to a temperature sufficiently lower than the softening point of the resin.

As a result of measuring a gel time of the prepregs force-cooled, it was 45 seconds at 170° C., showing that the prepregs are ones in which the curing reaction greatly proceeded as compared with 130 seconds at 170° C. in an untreated prepreg.

While the invention has been described in detail and with reference to specific embodiments thereof, it will be apparent to one skilled in the art that various changes and modifications can be made therein without departing from the spirit and scope thereof.

What is claimed is:

1. A method of treating a glass fiber-based prepreg, which comprises heating a B-staged, glass fiber-based prepreg which has been cut into a predetermined size, for 3 to 10 seconds with a far infrared ceramic heater of the type which emits far infrared rays having a wavelength of from 1 to 30 μm to a temperature no higher than 5° C. below the softening point of the matrix resin of the prepreg, thereby fixing matrix resin powder particles present on the surfaces and edges of the prepreg to the prepreg, which matrix resin powder particles were formed when the prepreg had been cut into the predetermined size, wherein said far infrared ceramic heater is such that (i) the percentage of radiation to a black body is at least 90% at a wavelength of 4 to 15 μm, and (ii) the radiation energy at a wavelength of 5 to 15 μm is at least 70% of the total radiation energy of far infrared ray which has a wavelength of 4 μm or more, and wherein the prepreg has a surface temperature which does not exceed at least 5° C. lower than the softening point of the matrix resin.

2. A method as in claim 1, wherein said far infrared ceramic heater is a type of using a ceramic resistor which generates heat upon application of electric current, and simultaneously emits far infrared rays, and not a type of heating a ceramic by a heating element.

* * * * *